United States Patent [19]

Ueno et al.

[11] Patent Number: 5,470,996
[45] Date of Patent: Nov. 28, 1995

[54] PATTERN FORMING MATERIAL AND PROCESS FOR FORMING PATTERN USING THE SAME

[75] Inventors: Takumi Ueno; Hiroshi Shiraishi, both of Hachioji; Nobuaki Hayashi, Saitama; Emiko Fukuma, Wako; Keiko Tadano, Kodaira, all of Japan

[73] Assignees: Hitachi, Ltd.; Hitachi Chemical Company, Ltd., both of Tokyo, Japan

[21] Appl. No.: 119,802

[22] Filed: Sep. 13, 1993

Related U.S. Application Data

[60] Continuation of Ser. No. 862,947, Apr. 3, 1992, abandoned, which is a division of Ser. No. 493,533, Mar. 14, 1990, Pat. No. 5,118,582.

[30] Foreign Application Priority Data

Mar. 20, 1989  [JP]  Japan .................... 1-066281

[51] Int. Cl.⁶ .................... C07C 309/65; C07C 309/66
[52] U.S. Cl. .................................................... 558/46
[58] Field of Search ........................................ 558/86

[56] References Cited

U.S. PATENT DOCUMENTS 3,346,612  10/1967  Hansen .................... 558/46
3,622,610  11/1971  Hausermann et al. .................... 558/46

FOREIGN PATENT DOCUMENTS 102450   3/1984   European Pat. Off. .
164248  12/1985   European Pat. Off. .
58-114030  7/1983  Japan .

OTHER PUBLICATIONS

Castellino et al., J. Org. Chem., 51, 1006 (1986).
Schlegel et al., Chem. Mater., 2(3), 299–305 (1990) (Chem. Abstr., 112, 226587q, 1990).
Hayakawa et al., 112—169183d (1990)—Abstract of Kokai Tokkyo Koho JP 01,182,089 (1989).
Stott et al., Chem. Abstr., 94—156,889y (1981).

Primary Examiner—Nicky Chan
Attorney, Agent, or Firm—Pennie & Edmonds

[57] ABSTRACT

A pattern can be formed on a substrated using a pattern forming material comprising (a) a medium, e.g. a polymer or compound, having reactivity for changing solubility in an alkali aqueous solution by a reaction using an acid as a catalyst, and (b) as an acid precursor an alkylsulfonic acid ester obtained from a compound having at least two phenolic hydroxyl groups.

1 Claim, No Drawings

PATTERN FORMING MATERIAL AND PROCESS FOR FORMING PATTERN USING THE SAME

CROSS REFERENCE

This is a continuation of application Ser. No. 07/862,947, filed Apr. 3, 1992, now abandoned; which is a divisional of application Ser. No. 07/493,533, filed Mar. 14, 1990, now U.S. Pat. No. 5,118,582.

BACKGROUND OF THE INVENTION

This invention relates to a pattern forming material, an acid precursor used therein, and a process for forming a pattern.

As to a pattern forming process comprising imagewise exposure to actinic radiation such as ultraviolet light to form an acid on a patterned latent image forming portion, changing the solubility for a developing solution of exposed portions and non-exposed portions to the actinic radiation by the reaction using the acid as a catalyst, and developing to form a pattern and pattern forming materials used therein, various proposals have been disclosed, for example, in U.S. Pat. No. 3,779,778, Japanese Patent Examined Publication Nos. 62-39420 and 62-39421, Japanese Patent Unexamined Publication Nos. 59-45439 and 62-164045, etc. These proposals include the use of highly reactive media in the presence of an acid catalyst and acid precursors which form an acid by exposure to actinic radiation. As the acid precursors, there are used various diazonium salts, various halogen compounds, various onium salts, etc. Since the diazonium salts are generally limited in conditions for stable use, there is a problem in their stability when used as the acid precursor in practicable usable pattern forming materials. As to the halogen compounds to there, is a problem of causing environmental pollution when they are used in large amounts as the acid precursor in industrially usable pattern forming materials. Further, as to the onium salts which have a good effect for lowering solubility for an alkali aqueous solution, usually used as a developing solution for forming fine patterns in semiconductor industry, there is a problem in that the control of pattern formation is difficult when a positive type pattern is formed by a development using an alkali aqueous solution.

Therefore acid precursors overcoming these problems mentioned above have been desired.

SUMMARY OF THE INVENTION

It is an object of the present invention to provide a pattern forming material containing a special acid precursor which is chemically stable, causes no environmental pollution, is usable for the development using an alkali aqueous solution, and can provide a chemical-amplified resist composition with high degree of resolution and high sensitivity, and a process for forming a pattern using said pattern forming material.

The present invention provides a pattern forming material comprising a medium having reactivity for changing solubility in an alkali aqueous solution by a reaction using an acid as a catalyst, and as an acid precursor an alkylsulfonic acid ester obtained from a compound having at least two phenolic hydroxyl groups.

The present invention also provides an acid precursor which is an alkylsulfonic acid ester obtained from a compound having at least two phenolic hydroxyl groups, and used in a pattern forming material.

The present invention further provides a process for forming a pattern, which comprises the steps of forming a coating film on a substrate using a pattern forming material comprising a medium having reactivity for changing solubility in an alkali aqueous solution by a reaction using an acid as a catalyst and as an acid precursor an alkylsulfonic acid ester obtained from a compound having at least two phenolic hydroxyl groups, exposing the coating film to actinic radiation imagewisely to form a patterned latent image, accelerating with heating a reaction for changing solubility for an alkali aqueous solution on the patterned latent image portion, and developing the patterned latent image portion with an alkali aqueous solution used as a developing solution to form the desired pattern.

DESCRIPTION OF THE PREFERRED EMBODIMENTS

The pattern forming material of the present invention comprises a medium having reactivity for changing solubility in a alkali aqueous solution by a reaction using an acid as a catalyst, (hereinafter referred to as "reactive medium") and as an acid precursor an alkylsulfonic acid ester obtained from a compound having at least two phenolic hydroxyl groups, and if necessary a base resin.

As the reactive medium, there can be used a compound having reactivity for changing solubility in an alkali aqueous solution by a reaction using an acid as a catalyst (hereinafter referred to as "alkali solubility changing compound"), and/or a polymer having reactivity for changing solubility in an alkali aqueous solution by a reaction using an acid as a catalyst (hereinafter referred to as "alkali solubility changing polymer").

When the reactive medium has at least two phenolic hydroxyl groups, a part of the reactive medium can be changed to an alkylsulfonic acid ester moiety, which can sufficiently function as the acid precursor without using another acid precursor.

The reactive medium can be divided into two types, one of which increases solubility in the alkali aqueous solution by the reaction using an acid as a catalyst, and another of which decreases solubility in the alkali aqueous solution by the reaction using an acid as a catalyst.

As the reaction increasing the solubility in the alkali aqueous solution, there is a mechanism wherein an element for accelerating alkali solubility appears in the reactive medium by deprotection reaction caused by an acid catalyst, and a mechanism wherein an element for inhibiting alkali solubility disappears in the reactive medium by acid-catalyzed depolymerization of a polymer having alkali solubility inhibiting properties previously present in the reactive medium, and the like.

Examples of polymers among the reactive media causing deprotection reaction by the acid catalyst are alkali-soluble phenolic resins such as polyvinylphenol wherein the phenolic hydroxyl group is protected by a tetrahydropyranyl group, a furanyl group, a t-butoxycarbonyl group, or the like.

Examples of compounds among the reactive media causing deprotection reaction by the acid catalyst are phenolic compounds wherein the phenolic hydroxyl group is protected by a tetrahydropyranyl group, a furanyl group, a t-butoxycarbonyl group, or the like. Examples of the phenolic compounds are catechol, resorcinol, hydroquinone, pyrogallol, oxyhydroquinone, phloroglucinol, dihydrobenzophenone, trihydrobenzophenone, tetrahydrobenzophenone, a gallic acid ester, hydroxynaphthalene, etc.

Examples of polymers among the reactive media causing depolymerization by the acid are those having an acetal structure, a carbonate structure, or the like in the main chain, e.g. polyphthalaldehyde, polycarbonate, etc.

As the reaction decreasing the solubility in the alkali aqueous solution, there is a mechanism wherein a factor inhibiting alkali solubility appears in the reactive medium by polymerization or condensation reaction caused by an acid catalyst.

For example, in a reaction system comprising an alkali-soluble resin such as novolak resin and a compound having an epoxy group, a methoxymethyl group, a methylol group, a silanol group, or the like, the reactive medium per se is cross-linked by polymerization or condensation by the acid catalyst to decrease alkali solubility.

Examples of such compounds are hexamethoxymethyl melamine, 2,6-bis(hydroxymethyl)-4-t-butyl-1-hydroxybenzene, hexahydroxymethyl melamine, trihydroxymethylbenzene, diphenylsilanediol, triphenylsilanol, 1,3,5,7-tetrahydroxy-1,3,5,7-tetraphenylcyclohexane, etc.

Examples of polymers which make an alkali solubility inhibiting factor appear are epoxy novolak resins, polyphenylsilsesquioxane, polyvinylbenzyl acetate, etc.

The acid precursor used in the present invention is an alkylsulfonic acid ester obtained from a compound having at least two phenolic hydroxyl groups. Examples of such a phenolic compound are catechol, resorcinol, hydroquinone, pyrogallol, oxyhydroquinone, phloroglucinol, trihydroxybenzophenone, dihydroxybenzophenone, tetrahydroxybenzophenone, a gallic acid ester, etc. The esterification can be carried out by a conventional process, for example, reacting a phenolic compound with a reactive derivative of alkylsulfonic acid such as an acid chloride, etc.

It is preferable that the alkyl moiety of the reactive derivative of alkylsulfonic acid has 1 to 4 carbon atoms. The hydrogen atoms in the alkyl moiety can be substituted in part or in whole with halogen atoms having a large electronegativity such as fluorine, chlorine, etc.

Examples of the alkylsulfonic acid esters are tris(methanesulfonyloxy)benzene, tris(ethanesulfonyloxy)benzene, tris(propanesulfonyloxy)benzene, tris(butanesulfonyloxy)benzene, bis(methanesulfonyloxy)benzene, tris(methanesulfonyloxy)benzophenone, tetra(methanesulfonyloxy)benzophenone, tris(ethanesulfonyloxy)benzoic acid esters, or tris(trichloromethanesulfonyloxy)benzene.

All these compounds can form a compound such as a polyhydric phenol having one or more alkali affinity functional groups and an alkylsulfonic acid which is an acidic compound.

It is not necessary to esterify all the phenolic hydroxyl groups contained in the alkylsulfonic acid ester having at least two phenolic hydroxyl groups. By retaining non-esterified phenolic hydroxy group(s), it is possible to control the solubility of the reactive medium in the alkali aqueous solution.

The pattern forming material may further contain a base resin for imparting film-forming properties. Examples of the base resin are novolak resins, phenol resins, etc.

The pattern forming material of the present invention can be a positive-acting composition or a negative-acting composition.

In the case of the positive-acting composition, the composition can comprise (i) an alkali solubility changing polymer having film-forming properties (alkali solubility inhibition disappearing by the acid-catalyzed reaction) and the acid precursor, or (ii) an alkali solubility changing polymer or compound (alkali solubility inhibition disappearing by the acid-catalyzed reaction), the acid precursor and a base resin.

In the case of the negative-acting composition, the composition can comprise (iii) an alkali solubility changing polymer having film-forming properties (becoming an alkali solubility inhibiting substance by the acid-catalyzed reaction) and the acid precursor, or (iv) an alkali solubility changing polymer or compound (becoming an alkali solubility inhibiting substance by the acid-catalyzed reaction), the acid precursor and a base resin.

The acid precursor is preferably contained in the pattern forming material in an amount of 0.1 to 10% by weight. When the amount is too small, almost no effect of the acid precursor is admitted. On the other hand, when the amount is too much, the alkali solubility of non-exposed portions to actinic radiation remarkably decreases to make the pattern formation impossible.

The reactive medium can be contained in the pattern forming material in an amount of preferably 99.9% to 5% by weight, more preferably 5 to 75% by weight (considering the use of the base resin).

The base resin can be contained in the pattern forming material in an amount of preferably 25% to 95% by weight, more preferably 30% to 95% by weight.

According to the present invention, a pattern can be formed by the steps of forming a coating film on a substrate using the pattern forming material mentioned above, exposing the coating film to actinic radiation imagewisely to form a patterned latent image, accelerating with heating a reaction for changing solubility for an alkali aqueous solution on the patterned latent image portion, and developing the patterned latent image portion with an alkali aqueous solution used as a developing solution to form the desired pattern.

The acid precursor brings about hydrolysis reaction by exposure to KrF excimer laser, a short wavelength light of 300 nm or less from a Xe—Hg lamp, or actinic radiation such as ultraviolet light, deep ultraviolet light, electron beams, X-rays, ion beams. If the acid precursor is present in the reactive medium and a small amount of water molecules are substantially present therein, the hydrolysis reaction easily takes place to yield reaction products of a compound having phenolic hydroxyl groups and an alkylsulfonic acid. The compound having phenolic hydroxyl groups has an affinity for an alkali aqueous solution and does not have a significant deleterious effect on the developing properties when of using the alkali aqueous solution as a developing solution. Further, since the alkylsulfonic acid is a strong acid, it becomes a remarkably effective acid catalyst. A pattern forming material comprising the reactive medium and the acid precursor is coated on a substrate such as a silicon substrate to form a thin film, which is then exposed to actinic radiation imagewisely. On the exposed coating film portion, a change in solubility for the alkali aqueous solution takes place by the reaction catalyzed by the acid produced. By properly selecting a reactive medium which is increased or decreased in solubility for the alkali aqueous solution, there can be obtained a negative type or a positive type pattern. Since the above-mentioned reaction is a catalytic reaction, the dosage of actinic radiation can be small and the reaction is highly sensitive.

The dosage changes depending on which kind of pattern forming materials are used. In the case of the short wavelength light, the dosage is usually in the range of 0.1 mJ/cm$^2$ to 100 mJ/cm$^2$. In the case of the electron beams, the dosage is usually in the range of 0.1 μC/cm$^2$ to 100 μC/cm$^2$.

In the step of accelerating the reaction for changing the solubility for an alkali aqueous solution, heating is conducted usually in the range of 70° C. to 120° C., dependent on the resist compositions used, for usually 1 to 10 minutes.

Further, since the acid precursor and by-products obtained by the acid forming reaction of the acid precursor do not degrade the developing step when using an alkali aqueous solution as a developing solution, there is no fear of deteriorating resolution properties during the developing step.

The present invention is illustrated by way of the following Examples, in which all parts and percents are by weight unless otherwise specified.

Synthesis Example 1

Synthesis of methanesulfonic acid ester (1)

In a dried vessel, 1.24 g of pyrogallol was dissolved in pyridine dried with sodium hydroxide, and 4.2 g of methanesulfonyl chloride was added dropwise thereto. The resulting mixture was heated at 70° C. for 3 hours with stirring. After cessation of the stirring, the reaction solution was dropped into water to deposit a solid. After filtering, washing with water and drying in vacuum, there was obtained methanesulfonic acid ester (1).

Synthesis Example 2

Synthesis of methanesulfonic acid ester (2)

In a dried vessel, 1.7 g of ethyl gallate was dissolved in pyridine dried with sodium hydroxide, and 3.4 g of methanesulfonyl chloride was added dropwise thereto. The resulting mixture was heated at 70° C. for 3 hours with stirring. After stopping the stirring, the reaction solution was dropped into water to deposit a solid. After filtering, washing with water and drying in vacuum, there was obtained methanesulfonic acid ester (2).

Synthesis Example 3

Synthesis of ethanesulfonic acid ester (1)

In a dried vessel, 1.26 g of pyrogallol was dissolved in pyridine dried with sodium hydroxide, and 3.2 g of ethanesulfonyl chloride was added dropwise thereto. The resulting mixture was heated at 70° C. for 3 hours with stirring. After cessation the stirring, the reaction solution was dropped into water to deposit a solid. After filtering, washing with water and drying in vacuum, there was obtained ethanesulfonic acid ester (1).

Synthesis Example 4

Synthesis of ethanesulfonic acid ester (2)

In a dried vessel, 1.26 g of pyrogallol was dissolved in pyridine dried with sodium hydroxide, and 4.0 g of ethanesulfonyl chloride was added dropwise thereto. The resulting mixture was heated at 70° C. for 3 hours with stirring. After stopping the stirring, the reaction solution was dropped into water to deposit a solid. After filtering, washing with water and drying in vacuum, there was obtained ethanesulfonic acid ester (2).

Synthesis Example 5

Synthesis of ethanesulfonic acid ester (3)

Ethyl gallate in an amount of 1.9 g was dissolved in dioxane, and 3.9 g of ethanesulfonyl chloride was added dropwise thereto. Potassium hydroxide in an amount of 2.52 g was dissolved in water and added dropwise to the reaction solution. After stirring for 3 hours, the reaction solution was poured into water. After extracting with ether, the extract was washed with a saturated saline solution and dried over magnesium sulfate. After evaporating the solvent using a rotary evaporator, there was obtained ethanesulfonic acid ester (3).

Synthesis Example 6

Synthesis of ethanesulfonic acid ester (4)

2,3,4-Trihydroxybenzophenone in an amount of 2.3 g was dissolved in dioxane and 2.6 g of ethanesulfonyl chloride was added dropwise thereto. Potassium hydroxide in an amount of 2.3 g was dissolved in water and added dropwise to the reaction solution. After stirring for 3 hours, the reaction solution was poured into water. After salting out by adding an excess amount of common salt and filtering, the resulting solid was recrystallized from ethanol to give ethanesulfonic acid ester (4).

Synthesis Example 7

Synthesis of ethanesulfonic acid ester (5)

2,3,4-Trihydroxybenzophenone in an amount of 2.3 g was dissolved in dioxane and 3.9 g of ethanesulfonyl chloride was added dropwise thereto. Potassium hydroxide in an amount of 3 g was dissolved in water and added dropwise to the reaction solution. After stirring for 3 hours, the reaction solution was poured into water. After extracting with ether, the extract was washed with a saturated saline solution and dried over magnesium sulfate. After evaporating the solvent using a rotary evaporator, there was obtained ethanesulfonic acid ester (5).

Synthesis Example 8

Synthesis of buthanesulfonic acid ester (1)

In a dried vessel, 1.26 g of pyrogallol was dissolved in pyridine dried with sodium hydroxide, and 4.7 g of 1-butanesulfonyl chloride was added dropwise thereto. The resulting mixture was heated at 70° C. for 3 hours, with stirring. After cessation of the stirring, the reaction solution was poured into water. After extracting with ether, the extract was washed with a saturated saline solution and dried over magnesium sulfate. After evaporating the solvent using a rotary evaporator, there was obtained butanesulfonic acid ester (1).

EXAMPLE 1

A copolymer of p-hydropyranyloxystyrene and p-hydroxystyrene (copolymerization percent of p-hydropyranyloxystyrene 30% by mole) in an amount of 100 parts and 5 parts of methanesulfonic acid ester (1) were dissolved in methyl Cellosolve acetate to prepare a solution containing about 20% solid content. The solution was filtered using a Teflon membrane filter having a pore diameter of 0.2 μm to give a positive-type resist solution.

The resulting resist solution was spin coated on a silicon substrate and heated at 100° C. for 10 minutes to obtain a resist film of 0.6 μm thick. The resulting substrate was exposed to electron beams imagewisely to form a wiring pattern using an electron beam imaging apparatus. The accelerating voltage of the electron beams was 30 kV and the dosage was 4 μC/cm$^2$. After forming a latent image of wiring pattern, the substrate was subjected to heat treatment at 120° C. for 10 minutes to accelerate the reaction for increasing the solubility of the latent image portion in the resist for alkali aqueous solution. After the heat treatment, the latent image formed resist was developed with an aqueous solution containing 2.38% of tetramethylammonium hydroxide to give a positive-type resist pattern. The developing time was 100 seconds. The decrease in film thickness in non-exposed portions was hardly detected. Further, the obtained resist pattern had a good cross-sectional shape.

EXAMPLE 2

A positive-type resist pattern was formed in the same manner as described in Example 1 except for using ethanesulfonic acid ester (2) in place of the methanesulfonic acid ester (1) and using Cellosolve acetate as a solvent for the resist solution. The resulting resist pattern was as good as that obtained in Example 1.

EXAMPLE 3

Poly(p-trimethylsiloxystyrene) obtained by reacting N,O-bistrimethylsilylacetamide on poly(p-hydroxystyrene) [Marukarinka M, a trade name, mfd. by Maruzen Petrochemical Co., Ltd.) in acetonitrile in an amount of 100 parts and 5 parts of ethanesulfonic acid ester (1) were dissolved in Cellosolve acetate to prepare a resist solution having a solid content of about 20%. The resist solution was filtered using a Teflon membrane filter having a pore diameter of 0.2 μm to give a positive-type resist solution.

The resulting resist solution was spin coated on a silicon substrate and heated at 100° C. for 10 minutes to give a resist film of 0.6 μm thick. The resulting substrate was exposed to electron beams imagewisely to form a wiring pattern using an electron beam imaging apparatus. The accelerating voltage of the electron beams was 30 kV and the dosage was 20 μC/cm$^2$. After forming a latent image of the wiring pattern, the substrate was subjected to heat treatment at 120° C. for 10 minutes to accelerate the reaction for increasing the solubility of the latent image portion in the resist for alkali aqueous solution. After the heat treatment, the latent image formed resist was developed with an aqueous solution containing 2.38% of tetramethylammonium hydroxide to give a positive-type resist pattern. The developing time was 100 seconds. The decrease in film thickness in non-exposed portions was hardly detected. Further, the obtained resist pattern had a good cross-sectional shape.

EXAMPLE 4

A negative-type resist solution having a solid content of about 20% was prepared in the same manner as described in Example 1 by dissolving 80 parts of m,p-cresol novolak resin, 20 parts of diphenylsilanediol (a reactive medium) and 5 parts of methanesulfonic acid ester (1) in methyl Cellosolve acetate. Using the resist solution, a resist film was formed in the same manner as described in Example 1, followed by exposure to electron beams imagewisely to form a latent image of wiring pattern. The dosage was 8 μC/cm$^2$. After exposure to electron beams, heat treatment was conducted at 80° C. for 10 minutes to accelerate the reaction for decreasing the solubility of the latent image portion in the resist for an alkali aqueous solution. After the heat treatment, the latent image formed resist was developed using an aqueous solution containing 2.38% of tetramethylammonium hydroxide with a developing time of 100 seconds to obtain a negative-type resist pattern. The resulting aluminum wiring pattern was as good as that obtained in Example 1.

EXAMPLE 5

A negative-type resist solution having a solid content of about 20% was prepared in the same manner as described in Example 1 by dissolving 90 parts of m,p-cresol novolak resin, 10 parts of methylol resin [Methylon 75108, a trade name, md. by BTL Specialty Resin Corp. (U.S.)] and 5 parts of methanesulfonic acid ester (1) in Cellosolve acetate. Using the resist solution, a good negative-type resist pattern was obtained in the same manner as described in Example 1 with the electron beam dosage of 10 μC/cm$^2$. As the developing solution for the upper resist, there was used an aqueous solution containing 2.38% of tetramethylammonium hydroxide. The developing time was 90 seconds.

Example 6

A negative-type resist solution having a solid content of about 20% was prepared in the same manner as described in Example 1 by dissolving 90 parts of poly(p-hydroxystyrene) [Marukarinka M, a trade name, mfd. by Maruzen Petrochemical Co., Ltd.], 10 parts of methanol modified hexamethylol melamine resin [Cymel 300, a trade name, mfd. by Mitsui Cyanamide Co., Ltd.], and 10 parts of methanesulfonic acid ester (1) in methyl Cellosolve acetate. Using the resist solution, a good aluminum wiring pattern was obtained in the same manner as described in Example 1 with the electron beam dosage of 10 μC/cm$^2$. As the developing solution for the resist, there was used an aqueous solution containing 2.38% of tetramethylammonium hydroxide. The developing time was 300 seconds.

EXAMPLE 7

A resist film was formed in the same manner as described in Example 1 using the positive-type resist solution of Example 1. The resist film was exposed to a light of 249 nm from a Xe—Hg lamp using a band pass filter and via a hard mask with the dosage of 20 mJ/cm$^2$. A positive-type resist pattern was obtained by baking and development in the same manner as described in Example 1. The developing time was 100 seconds. The decrease of film thickness in the non-exposed portion was hardly detected. Further, the resulting resist pattern had a good cross-sectional shape.

In the above-mentioned Examples 1 to 7, the alkylsulfonic acid esters obtained in Synthesis Examples 1 to 8 were used as the acid precursor of the present invention. But the same results as in Examples 1 to 7 were obtained using other alkylsulfonic acid esters. When benzenesulfonic acid ester was used in place of the alkylsulfonic acid esters, the sensitivity was not so high.

Further, in Examples 1 to 7, electron beams and ultraviolet light were used as actinic radiation. In the present invention, X-rays and ion beams were also able to be used for latent image formation, since an acid was formed from the acid precursor when X-rays and ion beams were used.

In order to obtain film forming properties and alkali developing properties, a base resin such as a novolak resin, a phenolic resin, or the like was able to be used. In order to maintain good coating properties, it was preferable to use the base resin in an amount of 25% or more, more preferably 30% or more.

As the acid precursor, it was possible to use a polymer having phenolic hydroxyl groups, a part of which was changed to alkylsulfonic acid ester. In this case, the resulting resist composition had the same coating properties and alkali developing properties as those of Examples 1 to 7.

EXAMPLE 8

A polymeric inhibitor for alkali dissolution was synthesized as follows.

Poly(p-vinylphenol) having a weight average molecular weight of about 7000 [Marukarinka M, a trade name, mfd. by Maruzen Petrochemical Co., Ltd.] in an amount of 5 parts was dissolved in 70 parts of ethyl acetate. To this, 14 parts of dihydropyran was added and 0.05 part of concentrated hydrochloric acid was dropped with stirring. The resulting solution was allowed to stand at 25° C. for 200 hours. After washing with a saturated aqueous solution of sodium bicarbonate, 5 parts of anhydrous sodium sulfate was added to the resulting solution, followed by standing for about 10 hours. Then, only the solution portion was filtered. The filtrate was concentrated using an evaporator. To this, 30 parts of tetrahydrofuran was added to obtain a uniform solution, followed by pouring into a large amount of methanol to deposit a solid. Thus, there was obtained tetrahydropyranylated poly(p-vinylphenol) wherein 90% or more of hydroxyl groups in side chains of poly(p-vinylphenol) were protected with tetrahydropyranyl groups. The resulting polymeric compound was not dissolved in an alkali aqueous solution and was able to be mixed with an alkali-soluble cresol novolak resin and the like in any ratio to give a uniform and compatible coating film.

A positive-type resist solution having a solid content of about 20% was prepared by dissolving 90 parts of m,p-cresol novolak resin, 10 parts of the polymeric inhibitor for alkali dissolution obtained above, and 5 parts of 1,2,3-trimethylsulfonyloxy benzene in methyl Cellosolve acetate, followed by filtration using a Teflon membrane filter having a pore diameter of 0.2 µm. The resist solution was spin coated on a silicon substrate and heated at 100° C. for 10 minutes to give a resist film of 0.8 µm thick. The resulting substrate was exposed to electron beams imagewisely to form a wiring pattern using an electron beam imaging apparatus. The accelerating voltage of the electron beam was 30 kV, and the dosage was 0.8 µC/cm². After forming a latent image of the wiring pattern using the electron beams, the substrate was subjected to heat treatment at 100° C. for 10 minutes to accelerate the reaction for increasing the solubility of the latent image portion for alkali aqueous solution. After the heat treatment, the latent image formed resist was developed with an aqueous solution containing 2.38% of tetramethylammonium hydroxide to give a positive-type resist pattern. The developing time was 100 seconds. The obtained resist pattern had a good cross-sectional shape.

EXAMPLE 9

A polymeric inhibitor for alkali dissolution was synthesized as follows.

Poly(p-vinylphenol) having a weight average molecular weight of about 7000 [Marukarinka M, a trade name, mfd. by Maruzen Petrochemical Co., Ltd.] in an amount of 5 parts was dissolved in 70 parts of ethyl acetate. To this, 14 parts of dihydropyran was added and 0.05 part of concentrated hydrochloric acid was dropped with stirring well. The resulting solution was allowed to stand at 25° C. for about 50 hours. Thus, there was obtained tetrahydropyranylated poly(p-vinylphenol) wherein about 60% of hydroxyl groups in side chains of poly(p-vinylphenol) were protected with tetrahydropyranyl groups in the same manner as described in Example 8. The resulting polymeric compound was not dissolved in an alkali aqueous solution and was able to be mixed with an alkali-soluble cresol novolak resin and the like in any ratio to give a uniform and compatible coating film.

A positive-type resist solution having a solid content of about 20% was prepared by dissolving 90 parts of m,p-cresol novolak resin, 10 parts of the polymeric inhibitor for alkali dissolution obtained above, and 5 parts of 1,2,3-triethylsulfonyloxy benzene in Cellosolve acetate, followed by filtration using a Teflon membrane filter having a pore diameter of 0.2 µm. The resist solution was spin coated on a silicon substrate and heated at 100° C. for 10 minutes to give a resist film of 0.8 µm. The resulting substrate was exposed to electron beams imagewisely to form a wiring pattern using an electron beam imaging apparatus. The accelerating voltage of the electron beams was 30 kV and the dosage was 1.2 µC/cm². After forming a latent image of the wiring pattern using the electron beams, the substrate was subjected to heat treatment at 100° C. for 10 minutes to accelerate the reaction for increasing the solubility of the latent image portion for alkali aqueous solution. After the heat treatment, the latent image formed resist was developed with an aqueous solution containing 2.38% of tetramethylammonium hydroxide to give a positive-type resist pattern. The developing time was 100 seconds. The obtained resist pattern had a good cross-sectional shape.

EXAMPLE 10

A polymeric inhibitor for alkali dissolution was synthesized as follow.

Poly(p-vinylphenol) have a weight average molecular weight of about 7000 [Marukarinka M, a trade name, mfd. by Maruzen Petrochemical Co., Ltd.] in an amount of 5 parts was dissolved in 70 parts of ethyl acetate. To this, 14 parts of dihydropyran was added and 0.05 part of concentrated hydrochloric acid was dropped with stirring. The resulting solution was allowed to stand at 25° C. for about 200 hours. After washing with a saturated aqueous solution of sodium bicarbonate, 5 parts of anhydrous sodium sulfate was added to the resulting solution, followed by standing for about 10 hours. Then, only the solution portion was filtered. The filtrate was concentrated using an evaporator. To this, 30 parts of tetrahydrofuran was added to obtain a uniform solution, followed by pouring into a large amount of methanol to deposite a solid. Thus, there was obtained partially furanylated poly(p-vinylphenol) wherein 70% or more of hydroxyl groups in side chains of poly(p-vinylphenol) were protected with furanyl group. The resulting polymeric compound was not dissolved in an alkali aqueous solution and was able to be mixed with an alkali-soluble cresol novolak resin and the like in any ratio to give a uniform and compatible coating film.

A positive-type resist solution having a solid content of about 20% was prepared by dissolving 60 parts of m,p- cresol novolak resin, 40 parts of the polymeric inhibitor for alkali dissolution obtained above, and 5 parts of 1,2,3-triethylsulfonyloxy benzene in Cellosolve acetate, followed by filtration using a Teflon membrane filter having a pore diameter of 0.2 µm. The resist solution was spin coated on a silicon substrate and heated at 100° C. for 10 minutes to give a resist film of 0.8 µm thick. The resulting substrate was exposed to electron beams imagewise to form a wiring pattern using an electron beam imaging apparatus. The accelerating voltage of the electron beams was 30 kV, and the dosage was 3.2 µC/cm$^2$. After forming a latent image of the wiring pattern using the electron beams, the substrate was subjected to heat treatment at 100° C. for 10 minutes to accelerate the reaction for increasing the solubility of the latent image portion for alkali aqueous solution. After the heat treatment, the latent image formed resist was developed with an aqueous solution containing 2.38% of tetramethylammonium hydroxide to give a positive-type resist pattern. The developing time was 100 seconds. The obtained resist pattern had a good cross-sectional shape.

EXAMPLE 11

A polymeric inhibitor for alkali dissolution was synthesized as follows.

Poly(p-vinylphenol) having a weight average molecular weight of about 7000 [Marukarinka M, a trade name, mfd. by Maruzen Petrochemical Co., Ltd.] in an amount of 10 parts was dissolved in 100 parts of tetrahydrofuran. To this, a solution obtained by dissolving 9.3 parts of t-butoxy potassium in 100 parts of tetrahydrofuran was added, followed by dropwise addition of a solution obtained by dissolving 18.4 parts of t-butyl dicarbonate in 100 parts of tetrahydrofuran with well stirring. The resulting solution was poured into a large amount of ice water to deposit a solid. The solid was extracted with ethyl acetate, deposited with petroleum ether, followed by filtration and drying. Thus, there was obtained t-butoxylated poly(p-vinylphenol) wherein 70% of more of hydroxyl groups in side chains of poly(p-vinylphenol) were protected with t-butoxy groups. The resulting polymeric compound was not dissolved in an alkali aqueous solution and was able to be mixed with an alkali-soluble cresol novolak resin and the like in any ratio to give a uniform and compatible coating film.

A positive-type resist solution having a solid content of about 20% was prepared by dissolving 80 parts of m,p-cresol novolak resin, 20 parts of the polymeric inhibitor for alkali dissolution obtained above, and 5 parts of 1,2,3-triethylsulfonyloxy benzene in Cellosolve acetate, followed by filtration using a Teflon membrane filter having a pore diameter of 0.2 µm.

The resist solution was spin coated on a silicon substrate and heated at 80° C. for 10 minutes to give a resist film of 0.8 µm thick. The resulting substrate was exposed to electron beams imagewise to form a wiring pattern using an electron beam imaging apparatus. The accelerating voltage of the electron beams was 30 kV, and the dosage was 5.5 µC/cm$^2$. After forming a latent image of the wiring pattern using the electron beams, the substrate was subjected to heat treatment at 80° C. for 10 minutes to accelerate the reaction for increasing the solubility of the latent image portion for alkali aqueous solution. After the heat treatment, the latent image formed resist was developed with an aqueous solution containing 2.38% of tetramethylammonium hydroxide to give a positive-type resist pattern. The developing time was 100 seconds. The obtained resist pattern had a good cross-sectional shape.

In Examples 8 to 11, pattern forming materials were used which contained polymeric inhibitors for alkali dissolution obtained by protecting side chains of poly(p-vinylphenol) having a weight average molecular weight of about 7000 with acid unstable groups. When used poly(p-vinylphenol)s were used having various average molecular weights and various kinds of novolak resins, it was possible to form polymers wherein a part of side chains is decomposed by an acid-catalyzed reaction to form alkali affinity functional groups in the side chains. In any case, the resulting polymeric compounds were not dissolved in an alkali aqueous solution and were able to be mixed with alkali-soluble cresol novolak resins in any ratio to give uniform and compatible coating films.

The thus formed compatible coating films were able to decrease the dissolving rate in the alkali aqueous solution depending on the content of polymeric inhibitor for alkali dissolution. But when the weight average molecular weight was less than 2000, the resulting polymeric inhibitors were very low in the inhibitory action for alkali dissolution. Thus, the polymeric inhibitor for alkali dissolution has a weight average molecular weight of preferably 2000 or more, more preferably 5000 or more. The polymeric inhibitor for alkali dissolution has film forming properties and coating properties, so that it can be used alone. When an alkali-soluble resin is used together so as to improve alkali developing properties, the resulting positive-type pattern forming material is good in coating properties and alkali developing properties. But, when the content of the polymeric inhibitor for alkali solubility was longer than that of the alkali-soluble resin, the alkali developing properties were undesirably lowered causing a failure to obtain a good pattern.

As mentioned above, when the acid precursor is the compounds as used in Examples 8 to 11, the sensitivity of resist increases with an increase of the content in the pattern forming material. But when the content is too large, there arises a problem of degrading the coating properties. In the case of Examples 8 to 11, the content of the polymeric inhibitor for alkali dissolution, that is, the acid precursor, was preferably 30% or less. Further, in order to show effective sensitivity, the content of the acid precursor was preferably larger than 0.1%. The best results were obtained when an alkylsulfonic acid ester obtained from a compound having at least two phenolic hydroxyl groups was used as the acid precursor.

Examples 8 to 11, electron beams and deep ultraviolet light were used as the actinic radiation. However, it was possible to use ion beams, charged particle beams, X-rays, ultraviolet light, etc. For latent image formation in place of the electron beams and deep ultraviolet light.

As mentioned above, the pattern forming material of the present invention is highly sensitive to actinic radiation such as deep ultraviolet light, electron beams, X-rays, etc. Thus, various positive-type and negative-type resist compositions having good alkali developing properties and a high degree of resolution can be obtained. The pattern forming material of the present invention is suitable for minute processing of semiconductor devices and the like. Thus, it becomes possible to readily produce highly integrated semiconductor devices with high yield.

What is claimed is:

1. A compound obtained by reacting a phenolic compound having three or more phenolic hydroxyl groups selected from the group consisting of pyrogallol, phloroglucinol, trihydroxybenzophenone and tetrahydroxybenzophenone, with a reactive derivative of optionally chloro substituted alkylsulfonic acid, said obtained compound being capable of forming a compound having one or more phenolic hydroxyl groups and an alkylsulfonic acid when exposed to light or irradiation and is selected from the group consisting of tris(methanesulfonyloxy)benzene, tris(ethanesulfonyloxy)benzene, tris(propanesulfonyloxy)benzene, tris(butanesulfonyloxy)benzene, tris(methanesulfonyloxy)benzophenone, tetra(methanesulfonyloxy)benzophenone, and tris(trichloromethanesulfonyloxy)benzene.

* * * * *